(12) United States Patent
Takahara et al.

(10) Patent No.: US 11,894,256 B2
(45) Date of Patent: Feb. 6, 2024

(54) SUBSTRATE HOLDING MECHANISM, SUBSTRATE MOUNTING METHOD, AND SUBSTRATE DETACHING METHOD

(71) Applicant: Tokyo Electron Limited, Tokyo (JP)

(72) Inventors: Toshiaki Takahara, Yamanashi (JP); Fumito Kagami, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 48 days.

(21) Appl. No.: 17/453,208

(22) Filed: Nov. 2, 2021

(65) Prior Publication Data
US 2022/0157641 A1   May 19, 2022

(30) Foreign Application Priority Data
Nov. 16, 2020  (JP) ................. 2020-190285

(51) Int. Cl.
*H01L 21/687* (2006.01)
*H01L 21/683* (2006.01)

(52) U.S. Cl.
CPC .... *H01L 21/68735* (2013.01); *H01L 21/6838* (2013.01); *H01L 21/6875* (2013.01); *H01L 21/68742* (2013.01); *H01L 21/68785* (2013.01)

(58) Field of Classification Search
CPC ........... H01L 21/6838; H01L 21/68728; H01L 21/68735; H01L 21/68742; H01L 21/6875; H01L 21/68785
See application file for complete search history.

(56) References Cited

U.S. PATENT DOCUMENTS

| 4,788,994 A * | 12/1988 | Shinbara | ................. | B05C 11/08 156/345.55 |
| 4,978,412 A * | 12/1990 | Aoki | ................. | H01L 21/68728 118/728 |
| 6,168,668 B1 * | 1/2001 | Yudovsky | ............... | H01L 21/68 118/728 |

FOREIGN PATENT DOCUMENTS

| JP | 2016-197707 | 11/2016 |
| JP | 2020-145323 | 9/2020 |

* cited by examiner

Primary Examiner — Saul Rodriguez
Assistant Examiner — Brendan P Tighe
(74) Attorney, Agent, or Firm — IPUSA, PLLC

(57) ABSTRACT

A substrate holding mechanism includes: a mounting stage on which a substrate is mounted; a plurality of holding sections each of which includes an upper surface that holds a lower surface of a peripheral section of the substrate and includes a lower surface that pushes down an upper surface of the peripheral section of the substrate mounted on the mounting stage; a protrusion that is provided on the plurality of holding sections and that contacts an end surface of the substrate mounted on the mounting stage to correct a position of the substrate; a lifting and lowering mechanism configured to lift and lower the plurality of holding sections; and a horizontal moving mechanism configured to horizontally move the plurality of holding sections.

8 Claims, 19 Drawing Sheets

SUBSTRATE HOLDING MECHANISM, SUBSTRATE MOUNTING METHOD, AND SUBSTRATE DETACHING METHOD

CROSS-REFERENCE TO RELATED APPLICATION

The present application is based upon and claims priority to Japanese Patent Application No. 2020-190285, filed on Nov. 16, 2020, the entire contents of which are incorporated herein by reference.

BACKGROUND

1. Field

The present disclosure relates to a substrate holding mechanism, a substrate mounting method, and a substrate detaching method.

2. Background Art

A stage having a substrate support surface on which a bottom surface of the substrate is attracted and held and having a groove sectioned into a plurality of regions for attracting a wafer to the substrate holding surface is known (see, for example, Patent Document 1). In Patent Document 1, the entire substrate is attracted and held on the stage by sequentially repeating a process of allowing a part of the substrate to be sucked by at least one of the plurality of regions and then allowing another part of the substrate to be sucked by a region adjacent to said at least one of the plurality of regions.

PRIOR ART DOCUMENT

Patent Document

[Patent Document 1] Japanese Laid-open Patent Publication No. 2016-197707

The present disclosure provides a technique for adsorbing and holding a warped substrate on a mounting stage.

SUMMARY

According to one aspect of the present disclosure, a substrate holding mechanism includes: a mounting stage on which a substrate is mounted; a plurality of holding sections each of which includes an upper surface that holds a lower surface of a peripheral section of the substrate and includes a lower surface that pushes down an upper surface of the peripheral section of the substrate mounted on the mounting stage; a protrusion that is provided on the plurality of holding sections and that contacts an end surface of the substrate mounted on the mounting stage to correct a position of the substrate; a lifting and lowering mechanism configured to lift and lower the plurality of holding sections; and a horizontal moving mechanism configured to horizontally move the plurality of holding sections.

According to the present disclosure, it is possible to hold and adsorb a warped substrate on a mounting stage.

Figure 5A:
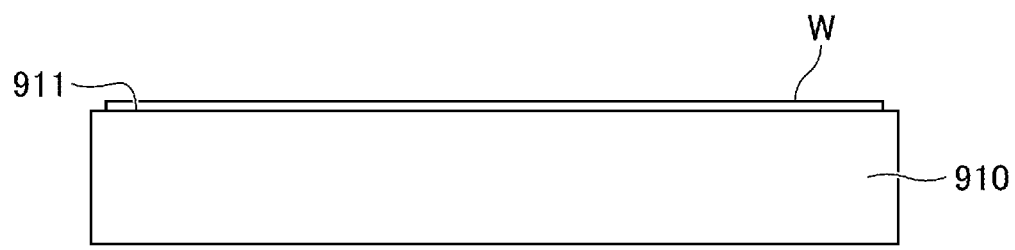
Figure 5B:
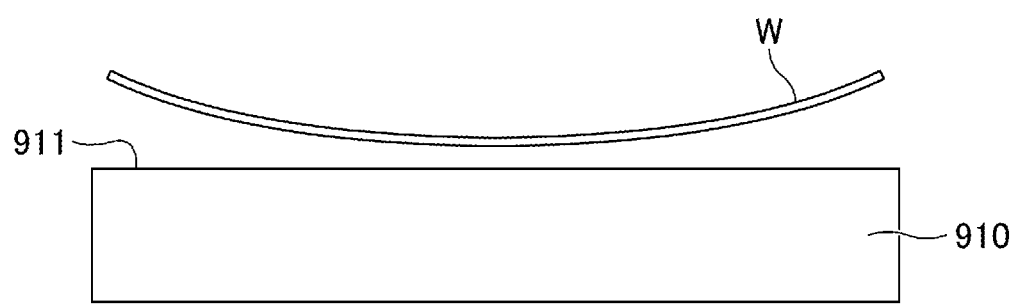
Figure 6:
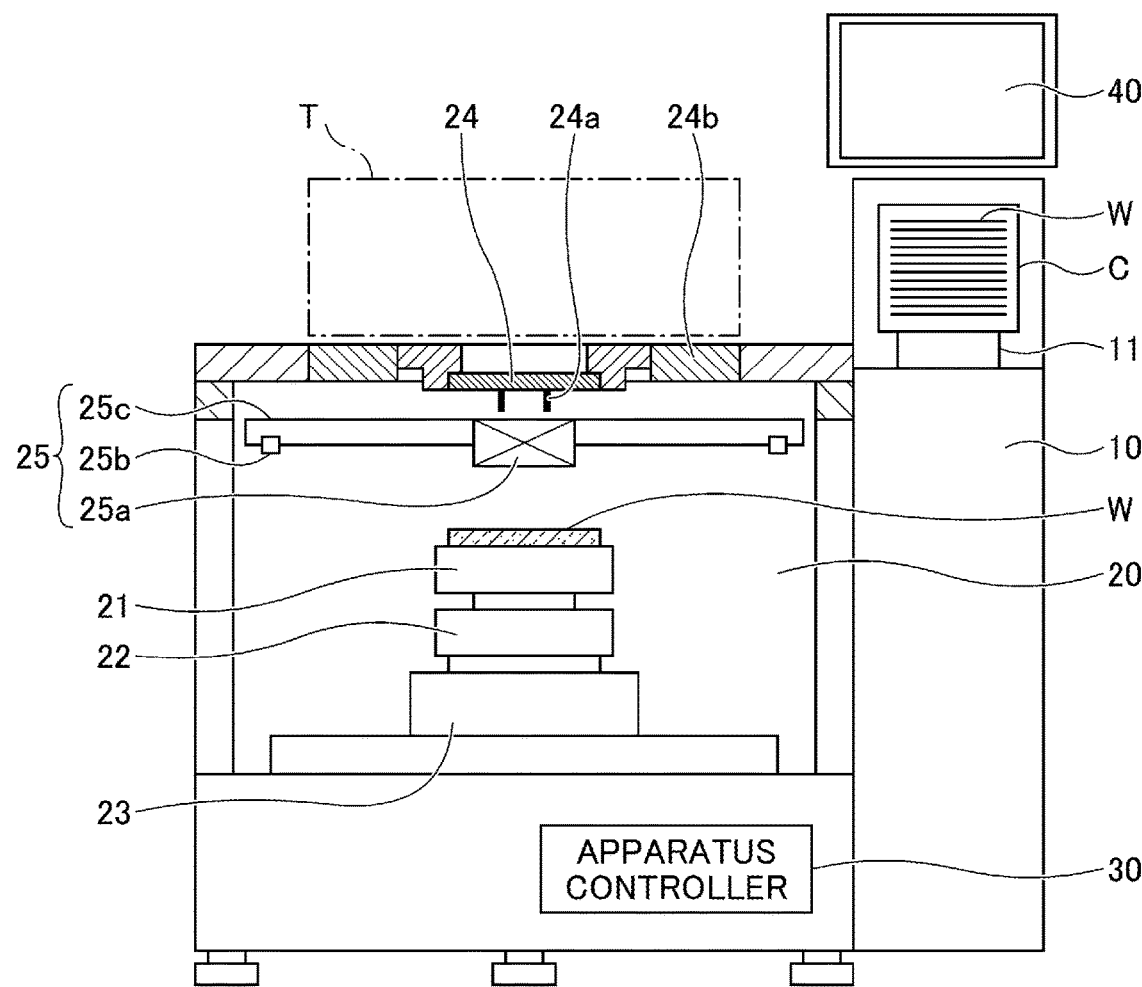
Figure 7:
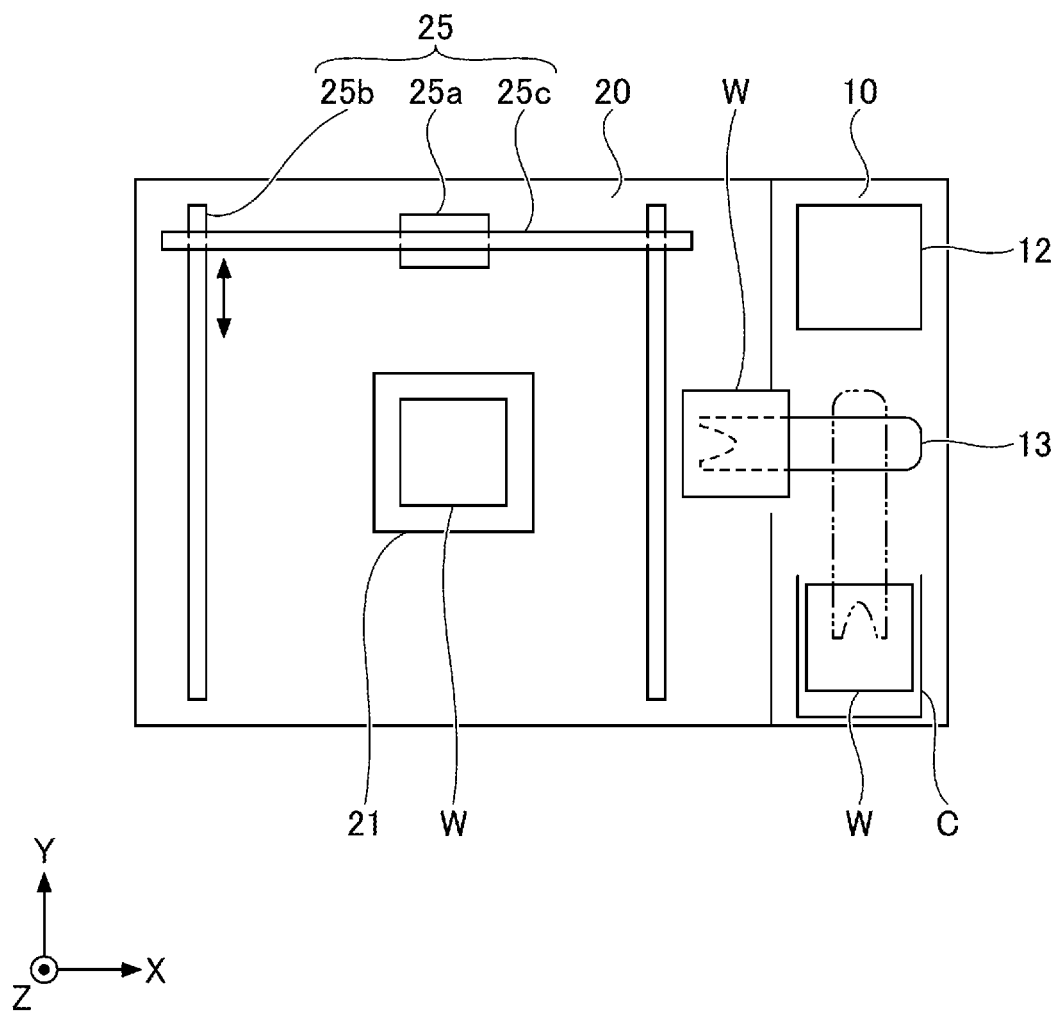
Figure 8:
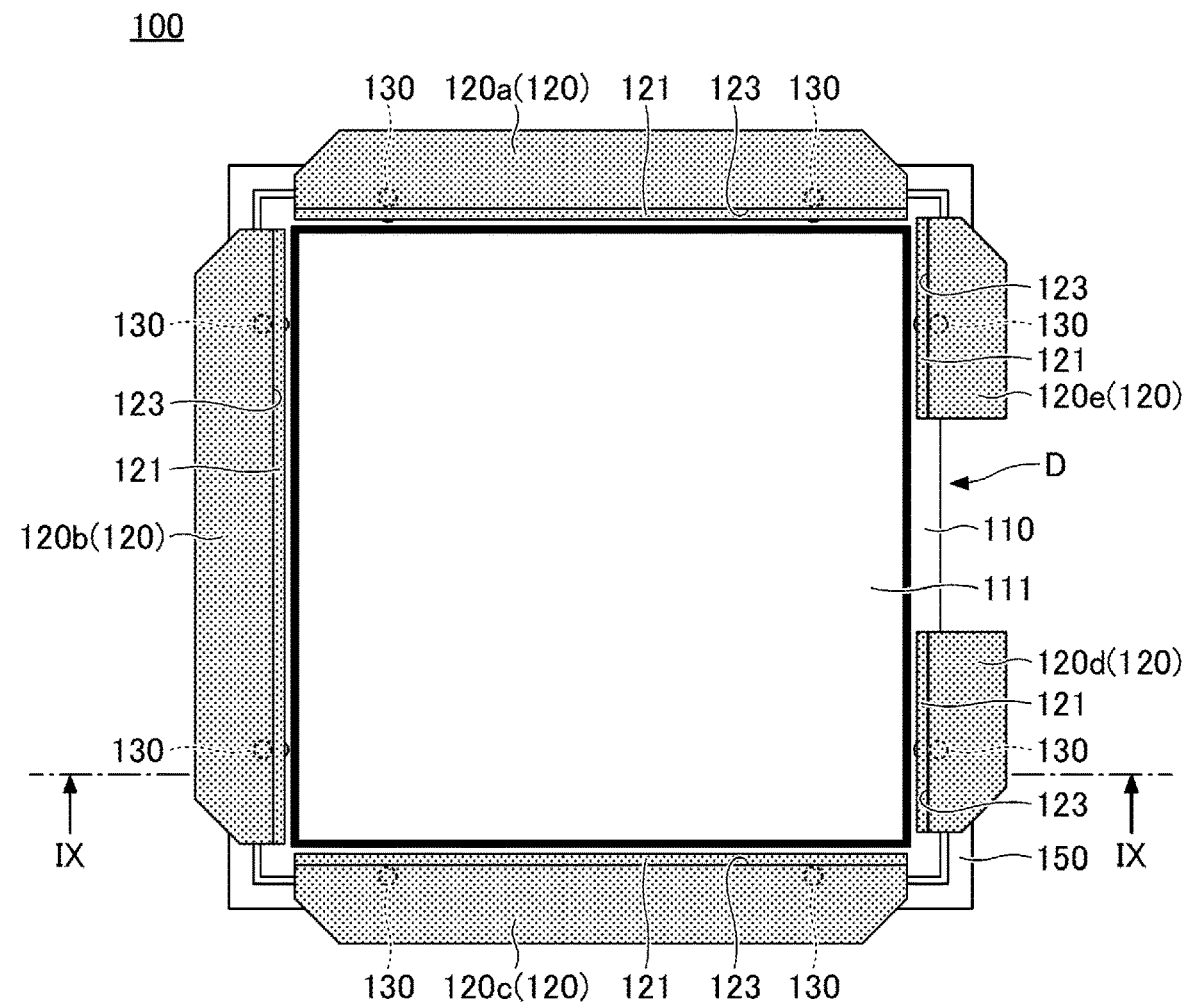
Figure 9:
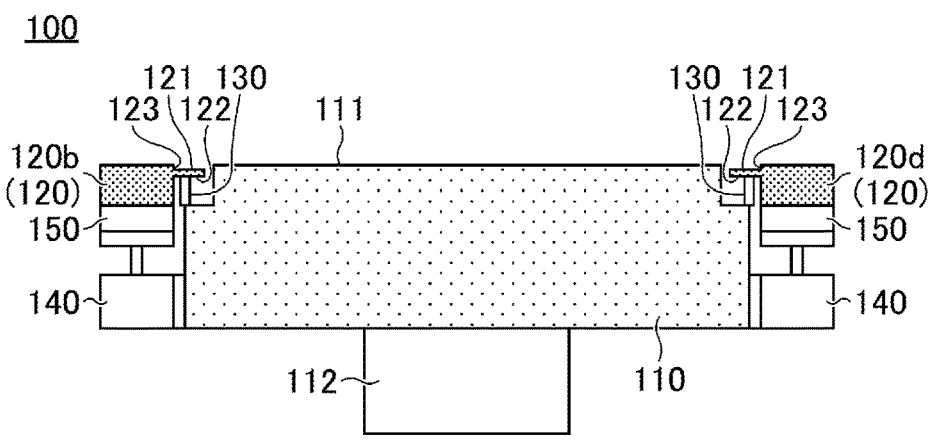
Figure 10A:
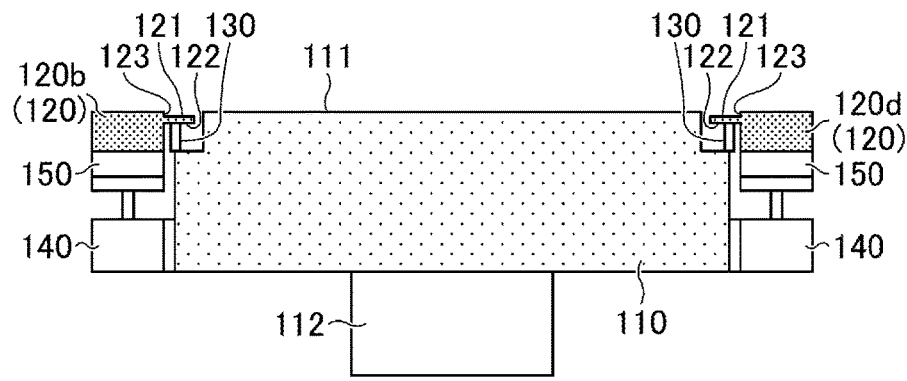
Figure 10B:
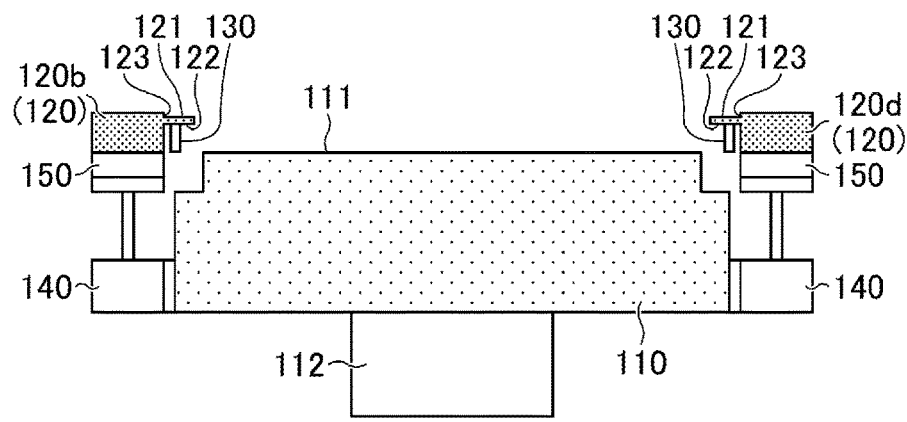
Figure 10C:
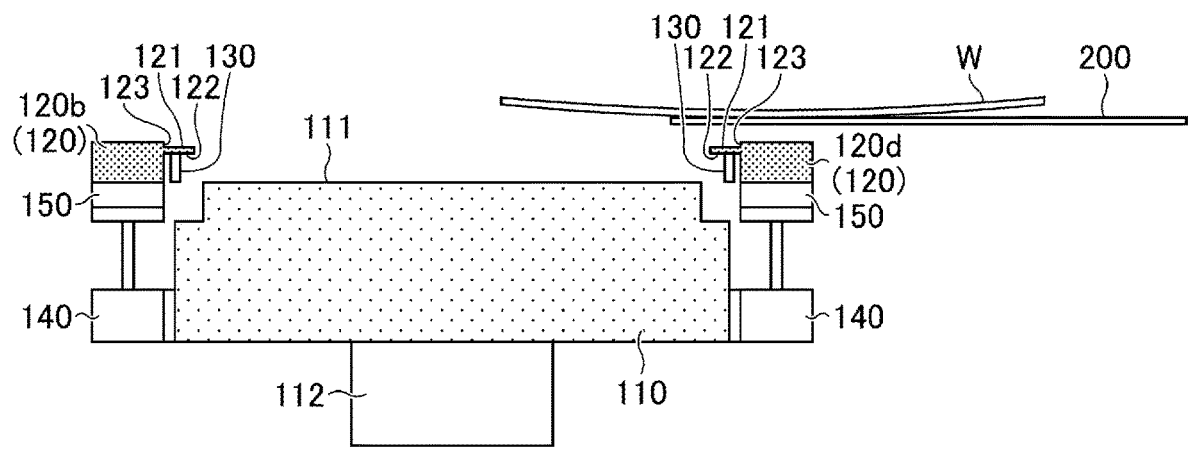
Figure 11A:
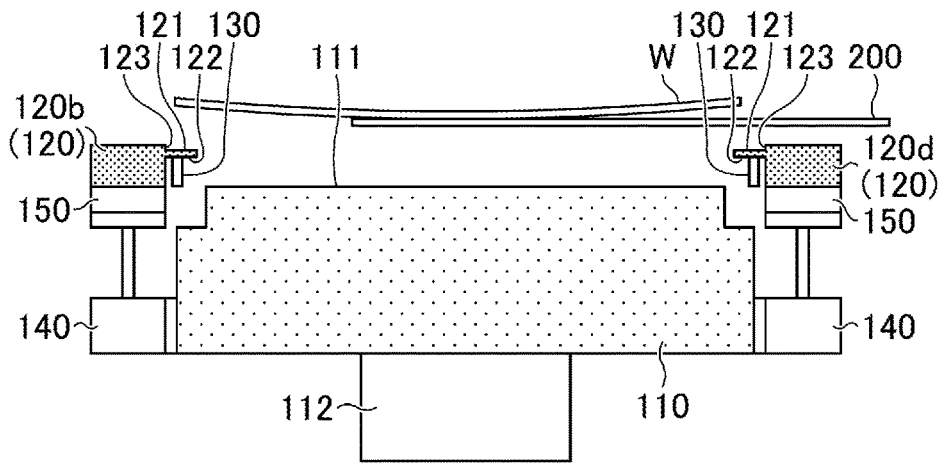
Figure 11B:
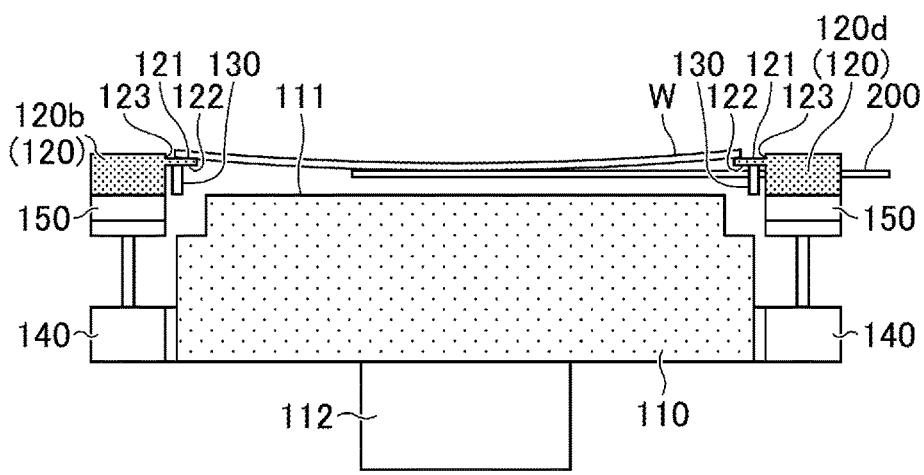
Figure 11C:
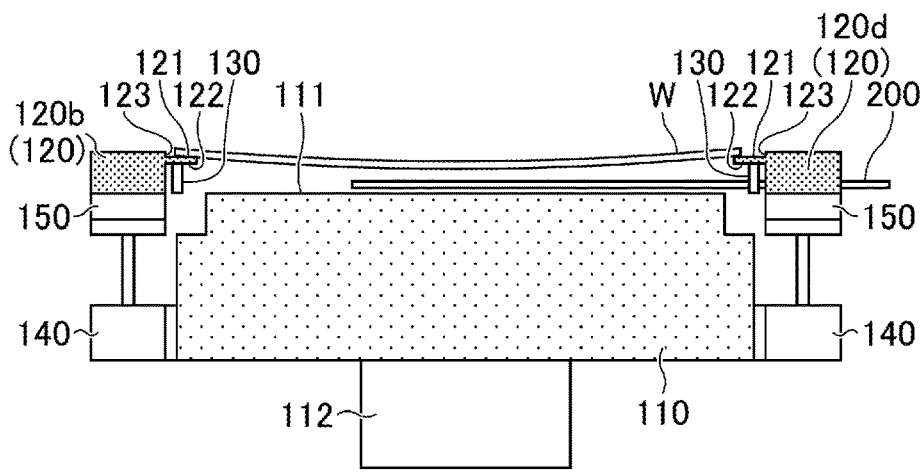
Figure 12A:
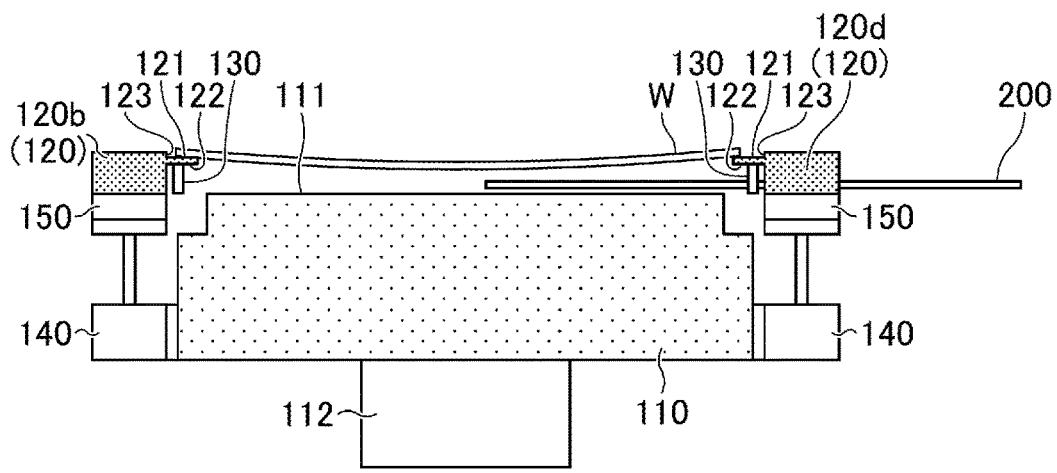
Figure 12B:
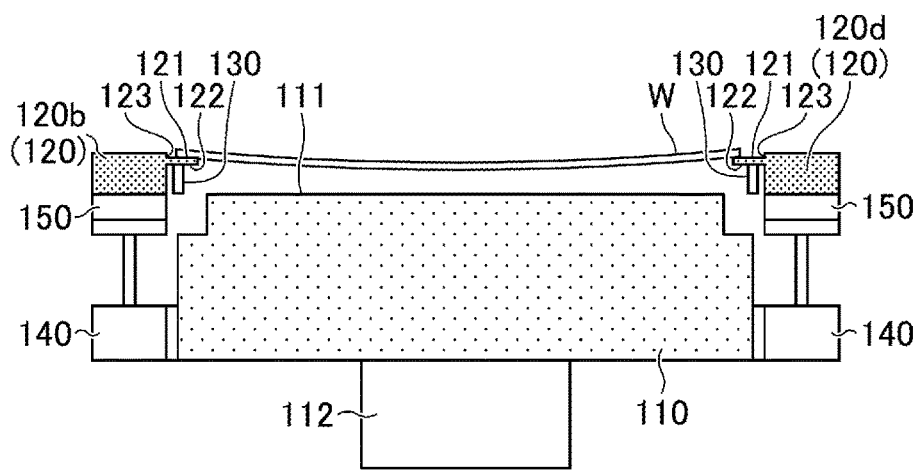
Figure 12C:
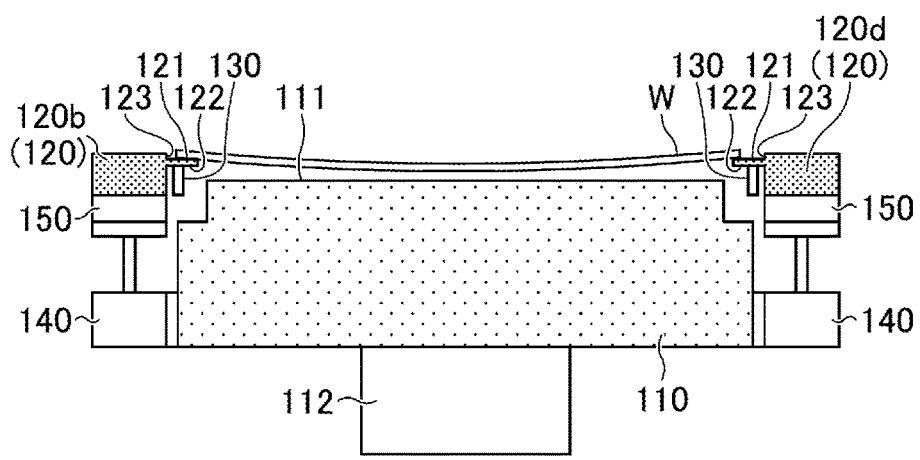
Figure 13A:
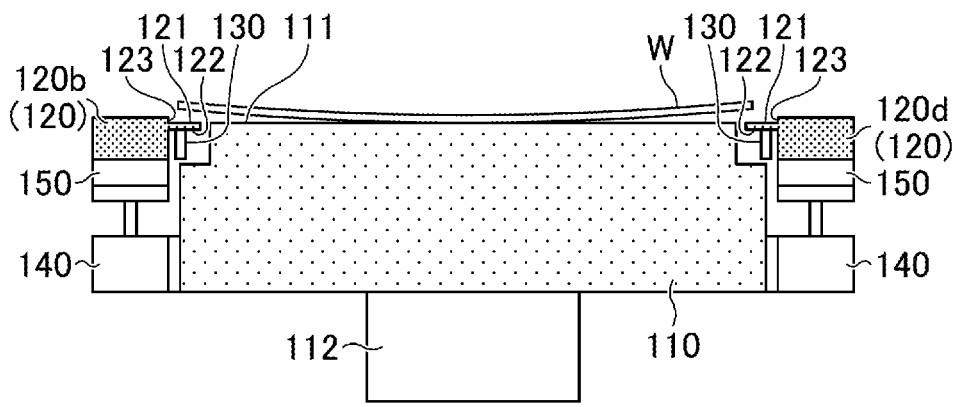
Figure 13B:
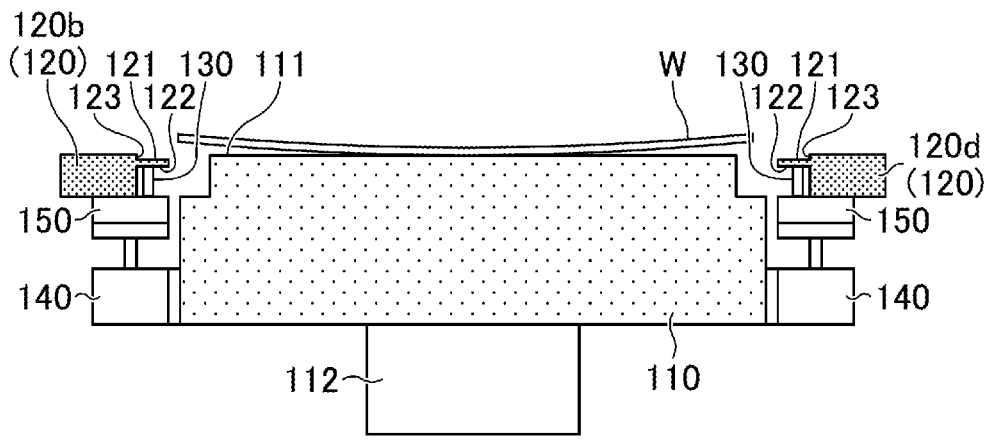
Figure 13C:
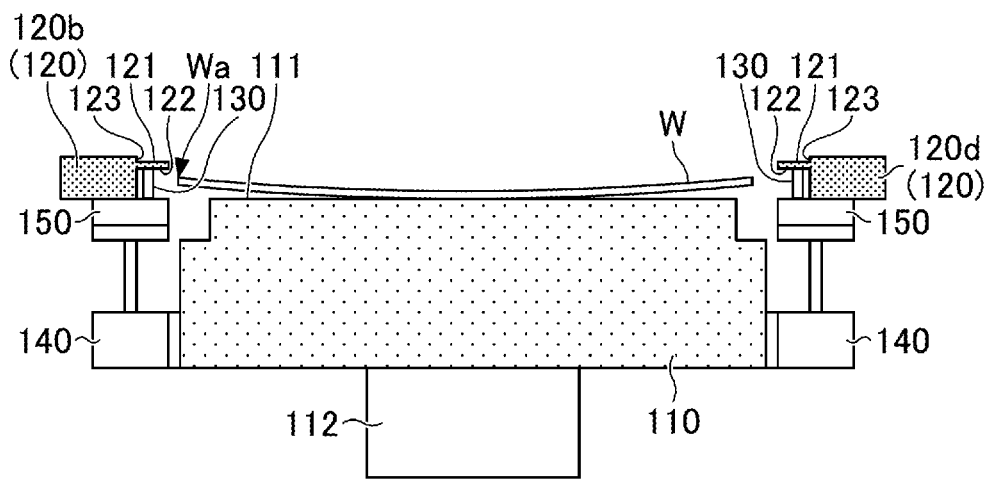
Figure 14A:
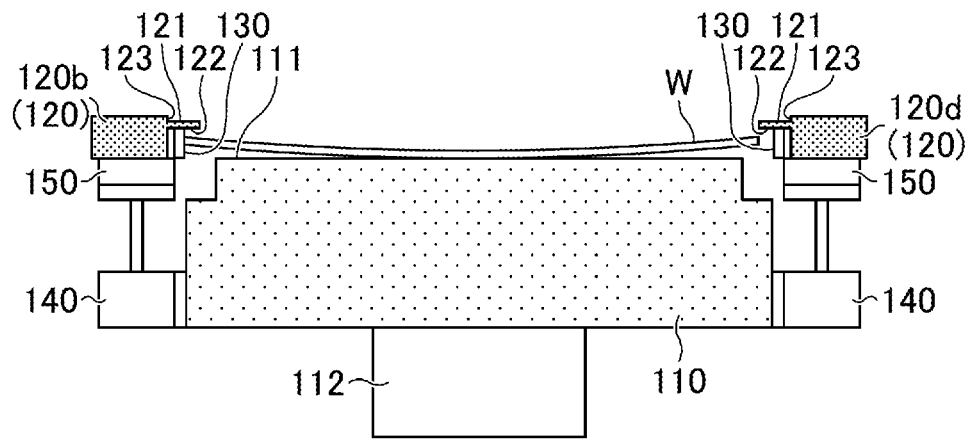
Figure 14B:
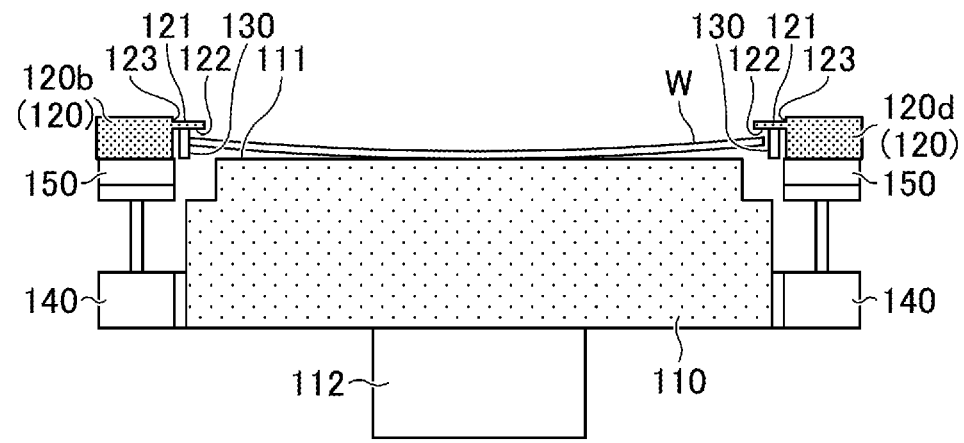
Figure 14C:
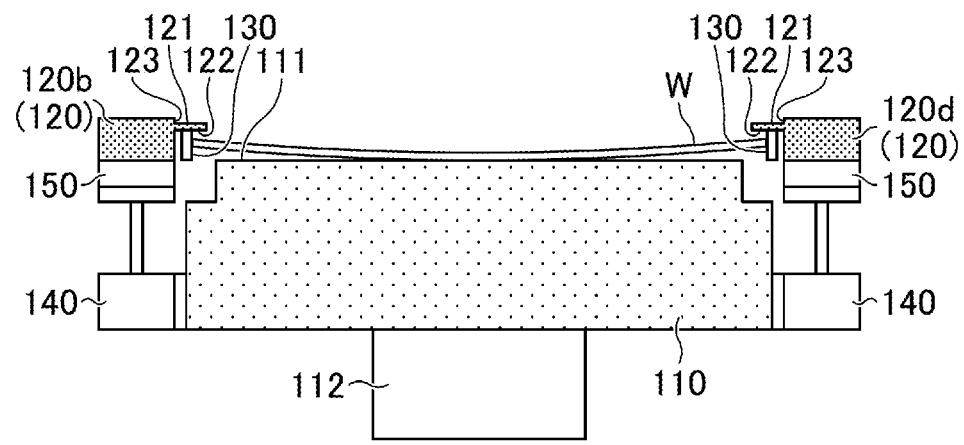
Figure 15A:
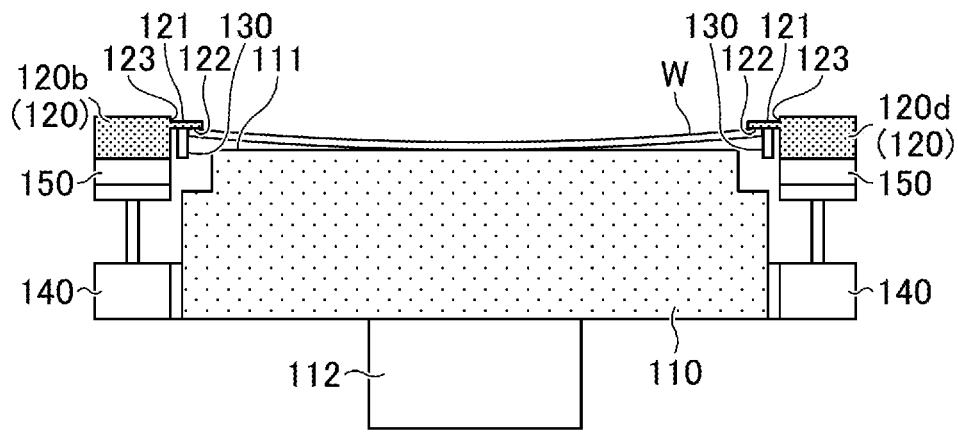
Figure 15B:
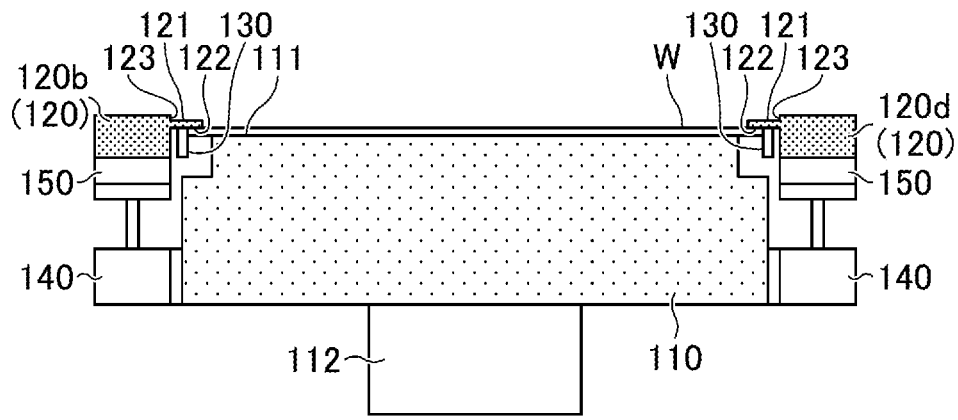
Figure 15C:
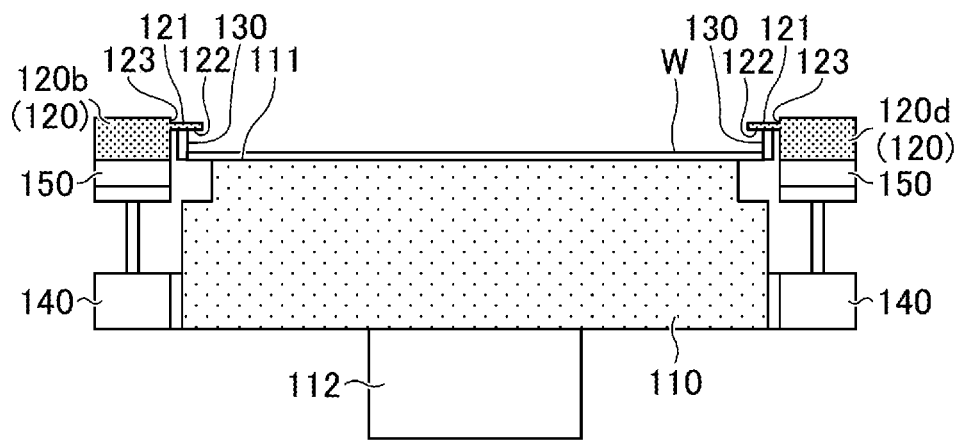
Figure 16A:
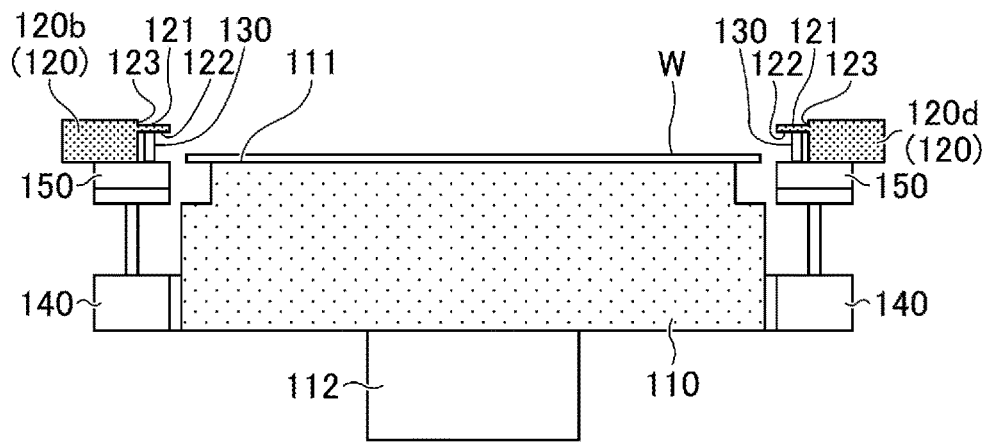
Figure 16B:
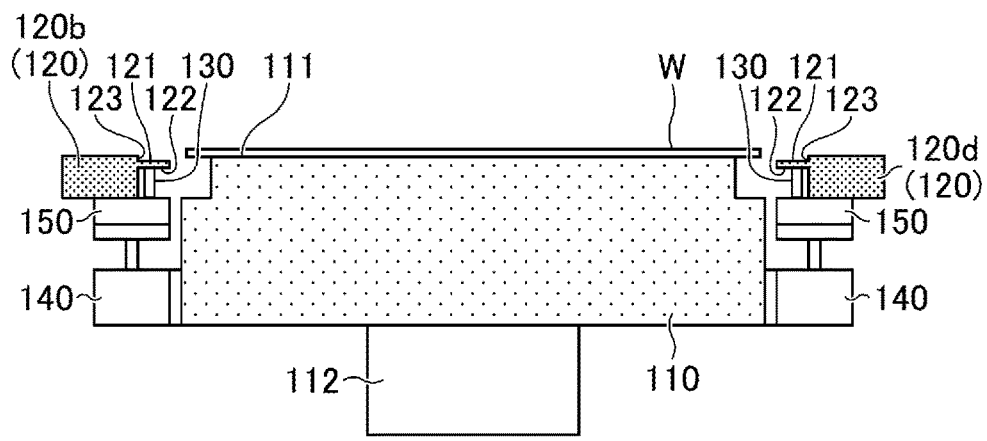
Figure 16C:
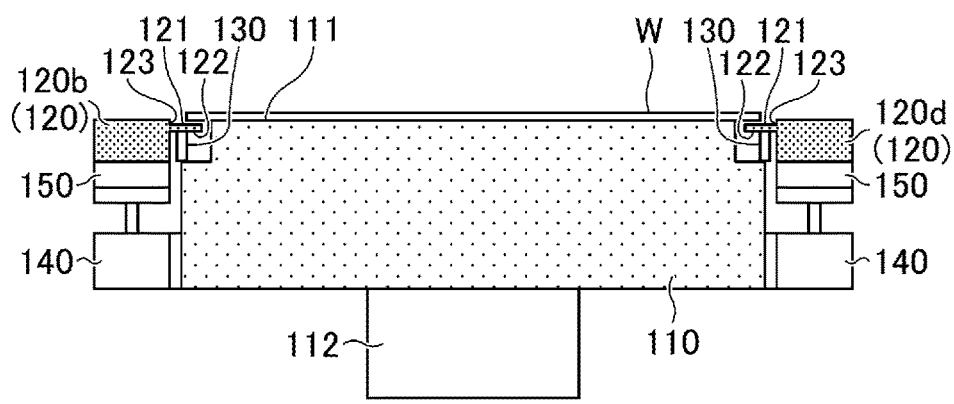
Figure 17A:
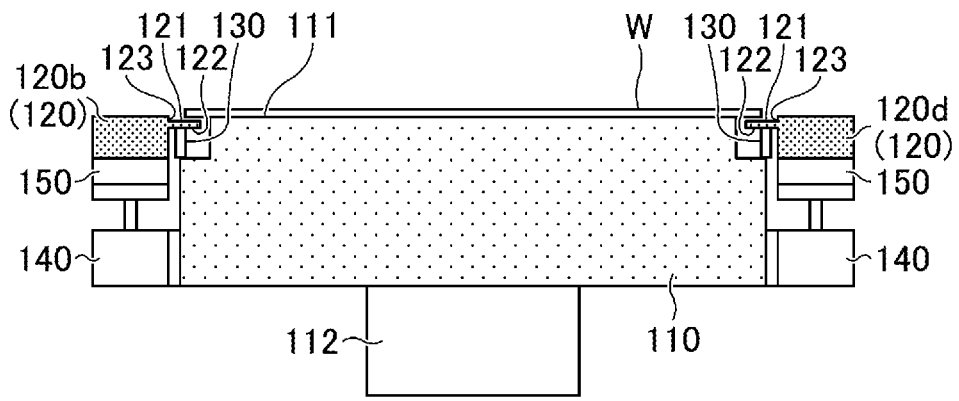
Figure 17B:
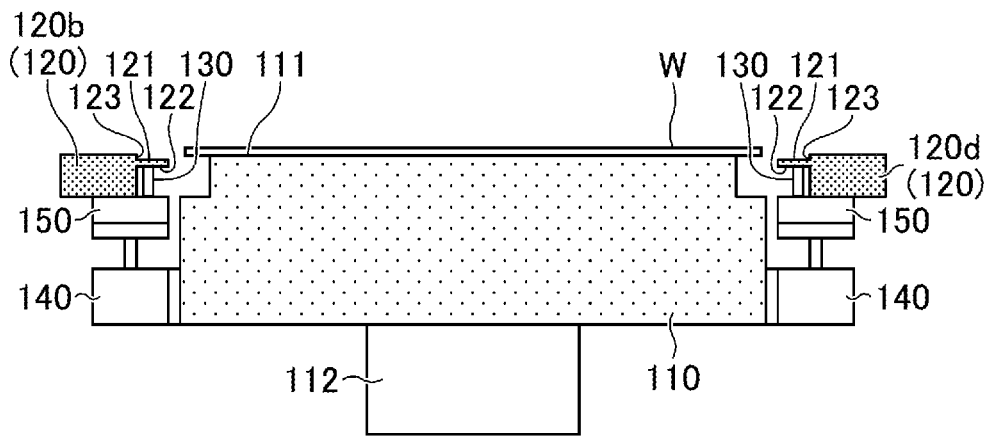
Figure 17C:
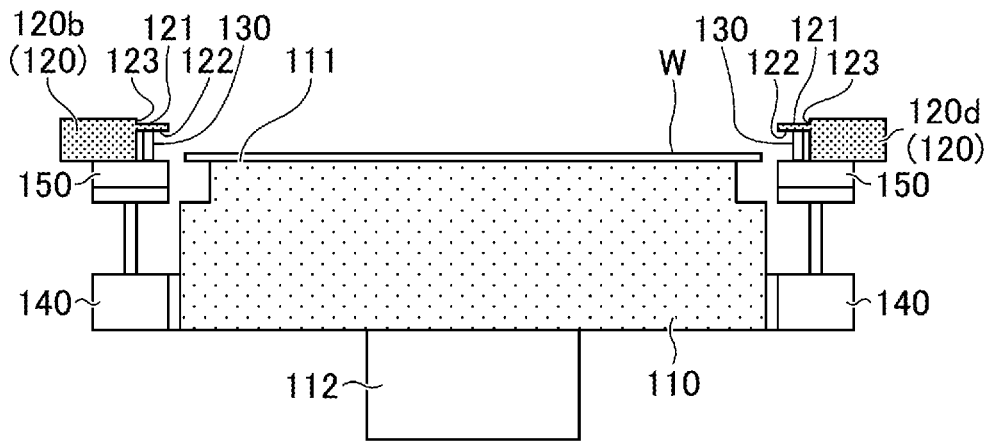
Figure 18A:
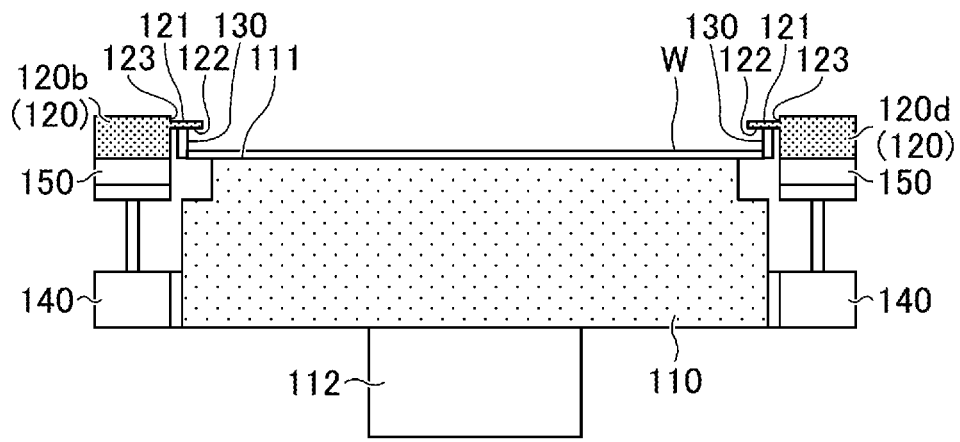
Figure 18B:
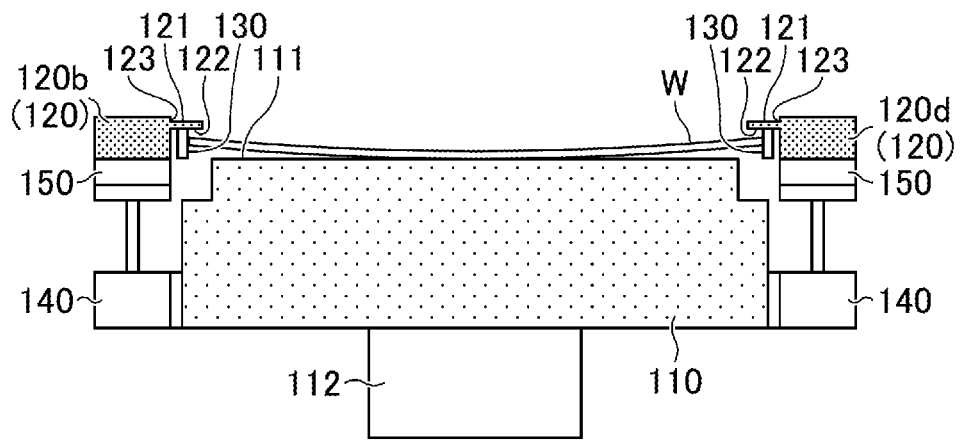
Figure 18C:
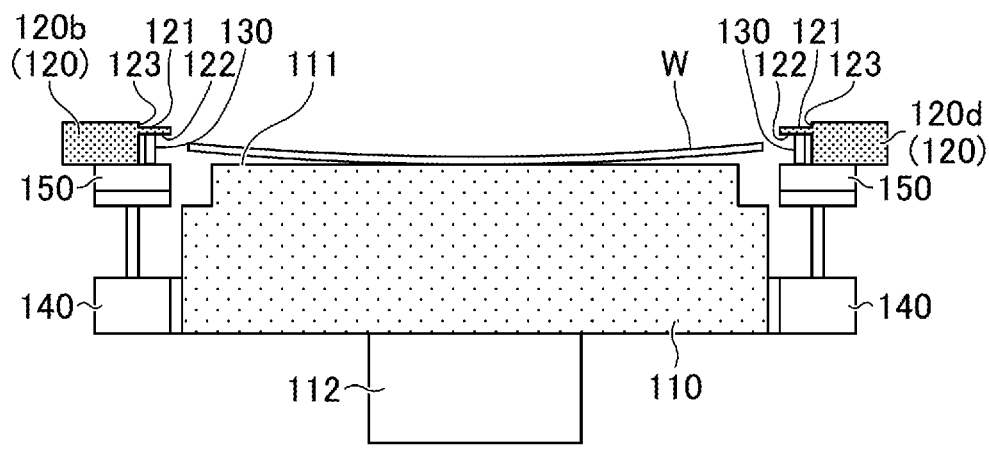
Figure 19A:
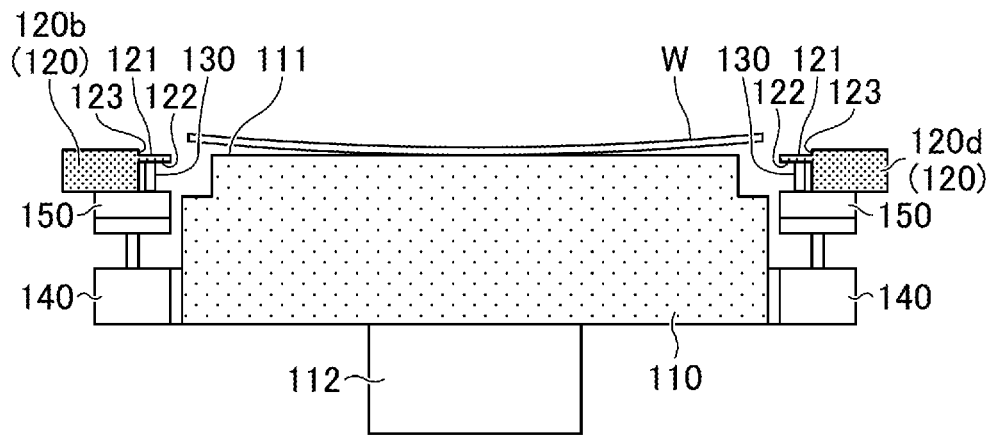
Figure 19B:
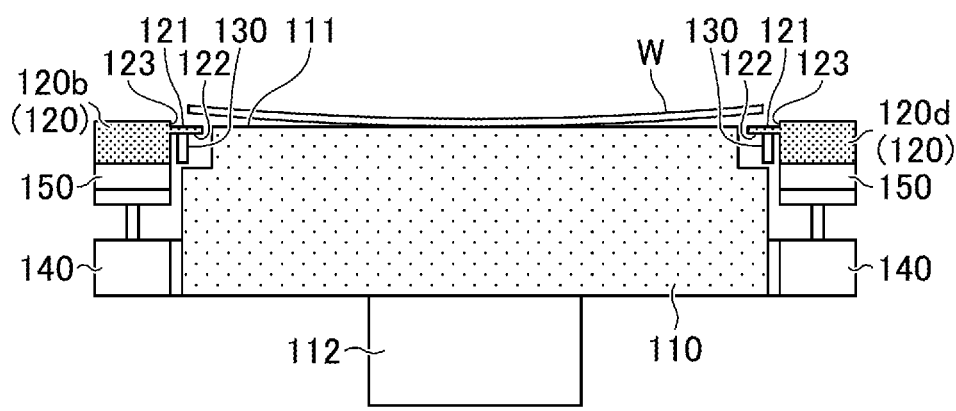
Figure 19C:
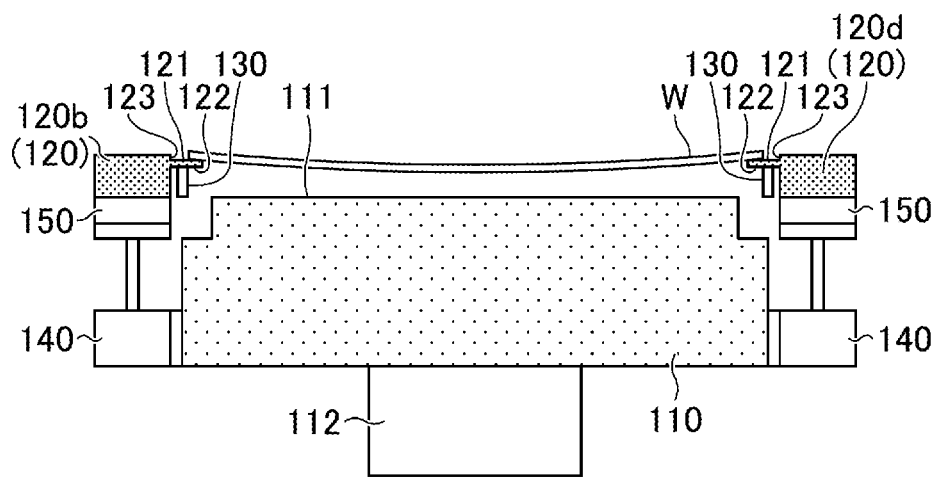
Figure 20A:
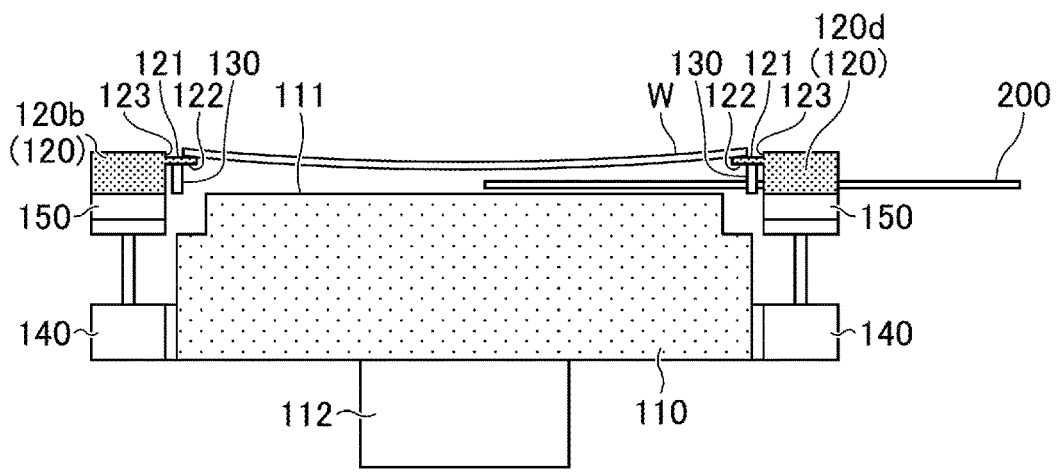
Figure 20B:
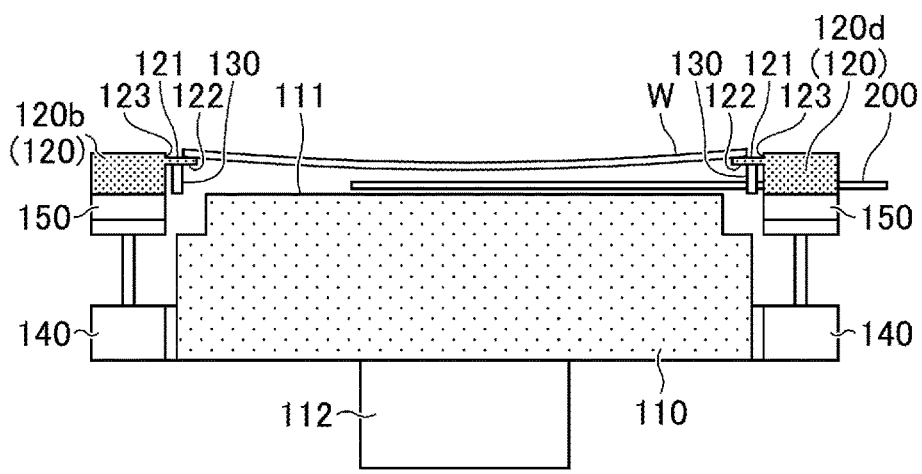
Figure 20C:
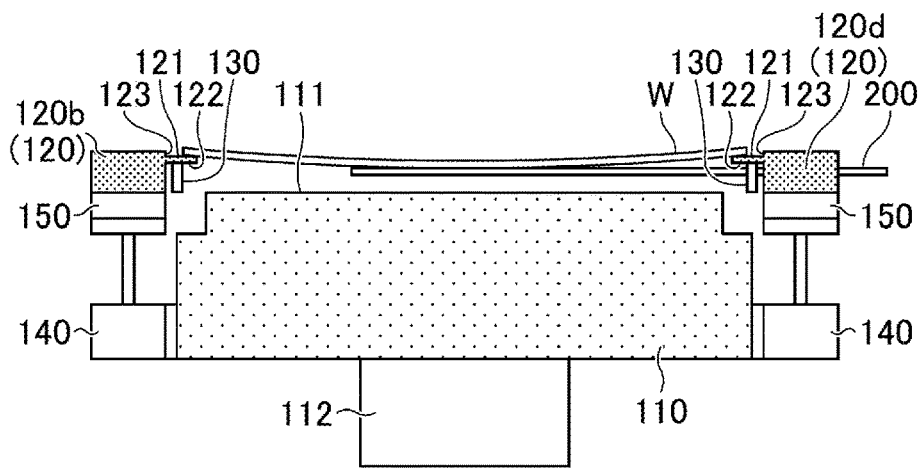
Figure 21A:
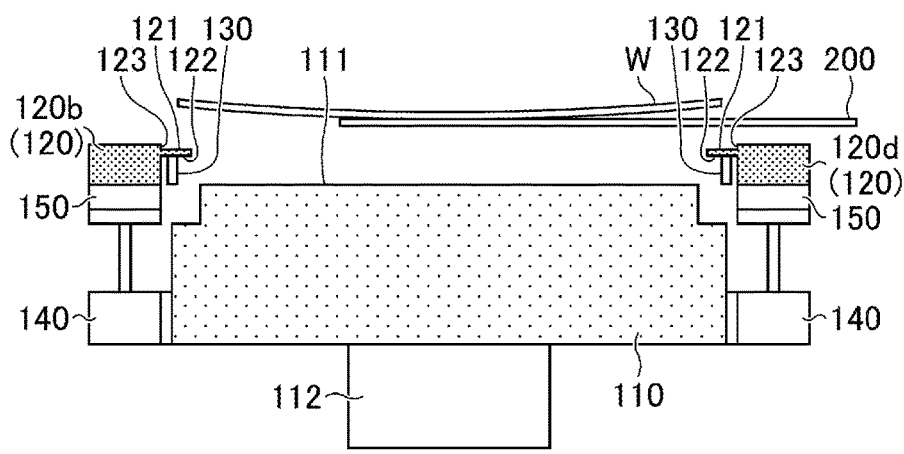
Figure 21B:
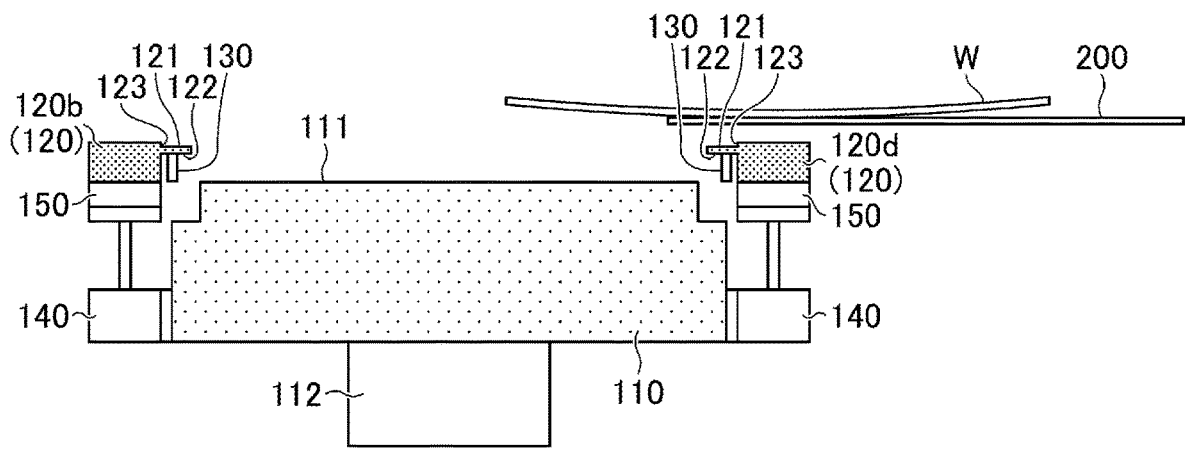
Figure 21C:
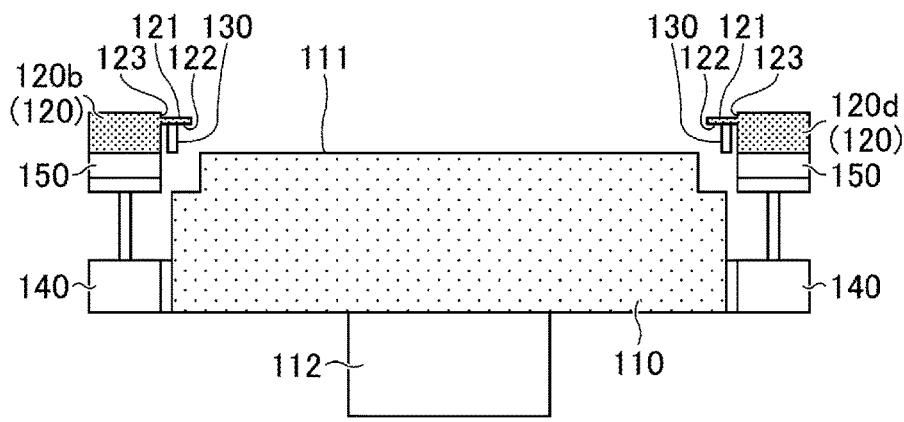
Figure 22:
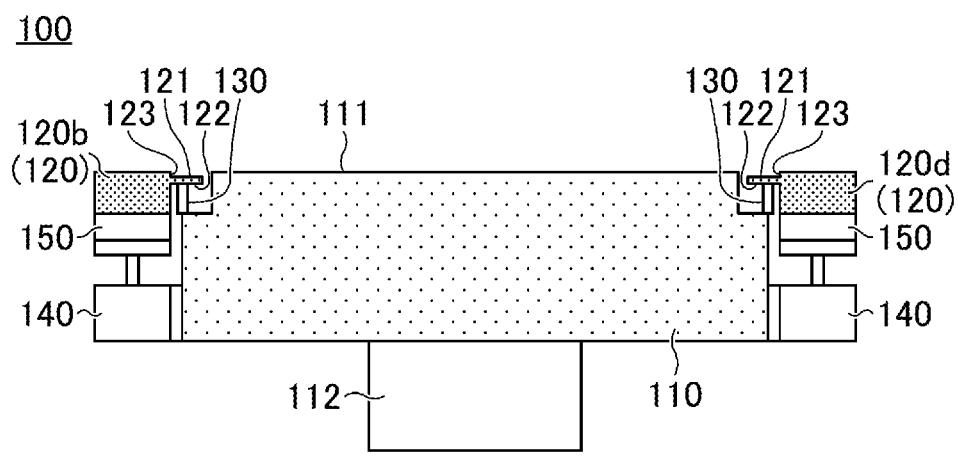

FIGS. 5A 5A and 5B are diagrams for explaining problems caused by warpage of a substrate;

FIG. 6 is a diagram illustrating an example of an inspection apparatus including a substrate holding mechanism according to an embodiment;

FIG. 7 is a plan view of the inspection system of FIG. 6;

FIG. 8 is a schematic plan view illustrating an example of the substrate holding mechanism according to the embodiment;

FIG. 9 is a schematic plan view illustrating an example of the substrate holding mechanism according to the embodiment;

FIGS. 10A to 10C are diagrams illustrating an example of steps of a substrate mounting method according to an embodiment;

FIGS. 11A to 11C are diagrams illustrating an example of steps of the substrate mounting method according to the embodiment;

FIGS. 12A to 12C are diagrams illustrating an example of steps of the substrate mounting method according to the embodiment;

FIGS. 13A to 13C are diagrams illustrating an example of steps of the substrate mounting method according to the embodiment;

FIGS. 14A to 14C are diagrams illustrating an example of steps of the substrate mounting method according to the embodiment;

FIGS. 15A to 15C are diagrams illustrating an example of steps of the substrate mounting method according to the embodiment;

FIGS. 16A to 16C are diagrams illustrating an example of steps of the substrate mounting method according to the embodiment;

FIGS. 17A to 17C are diagrams illustrating an example of steps of a substrate detaching method according to an embodiment;

FIGS. 18A to 18C are diagrams illustrating an example of steps of the substrate detaching method according to the embodiment;

FIGS. 19A to 19C are diagrams illustrating an example of steps of the substrate detaching method according to the embodiment;

FIGS. 20A to 20C are diagrams illustrating an example of steps of the substrate detaching method according to the embodiment;

FIGS. 21A to 21C are diagrams illustrating an example of steps of the substrate detaching method according to the embodiment; and FIG. 22 is a diagram illustrating an example of a step of the substrate detaching method according to the embodiment.

DESCRIPTION OF THE EMBODIMENTS

In the following, a non-limiting exemplary embodiment of the present disclosure will be described with reference to the drawings. In every drawing, the same or corresponding members or parts are designated by the same or corresponding reference numerals, and duplicate description is omitted as appropriate.

<Warpage of Substrate>

Figure 1A:
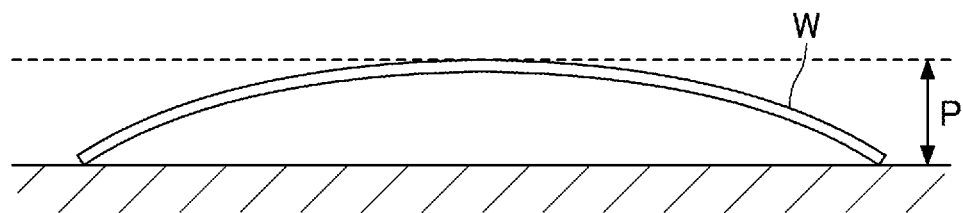
FIGS. 1A and 1B are diagrams for explaining warpage of a substrate.
Figure 1B:
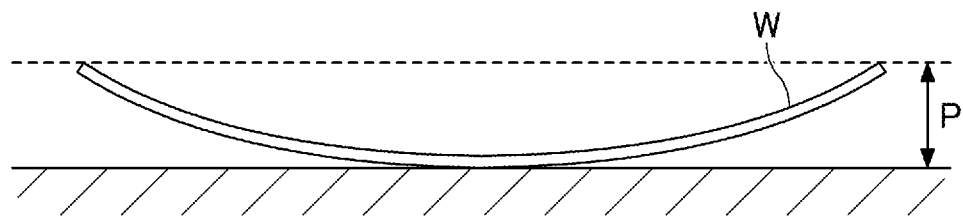

Referring to FIG. 1A and FIG. 1B, warpage of a substrate will be described. FIGS. 1A and 1B are diagrams for explaining warpage of a substrate, and are side views of the substrate.

As illustrated in FIG. 1A, a substrate W may have an upward warp shape that is curved to protrude upward. Also, as illustrated in FIG. 1B, the substrate W may have a downward warp shape that is curved to protrude downward. For example, in a case in which a substrate is a rectangular substrate having a size of 300 mm×300 mm, a thickness of 500 μm to 3000 μm, and a weight of 100 g to 1000 g, the substrate warpage amount P may be about 10 mm.

Referring to FIG. 2 to FIG. 5, problems that may be caused by warpage of the substrate W will be described. FIG. 2 to FIG. 5 are diagrams for explaining problems that may be caused by the warpage of the substrate W, and are side views of the substrate W. In the following, a case where the substrate W is mounted on a mounting surface 911 of a mounting stage 910 and vacuum adsorbed will be illustrated as an example.

Figure 2:
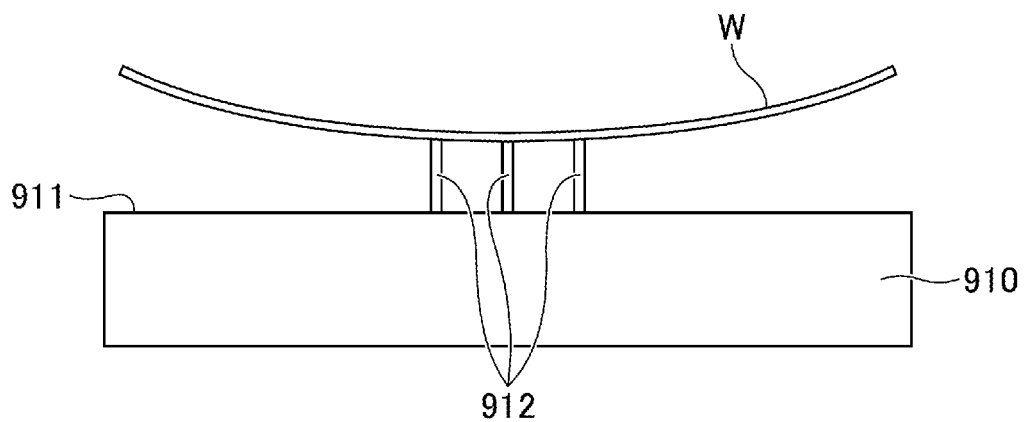
FIG. 2 is a diagram for explaining problems caused by warpage of a substrate.

As illustrated in FIG. 2, when the substrate W transferred by a transfer arm (not illustrated) to the mounting stage 910 is received by three support pins 912 supporting the lower surface near the center of the substrate W, the substrate W may slide on the three support pins 912 due to warpage of the substrate W. Therefore, it is difficult to transfer the substrate W stably.

Figure 3A:
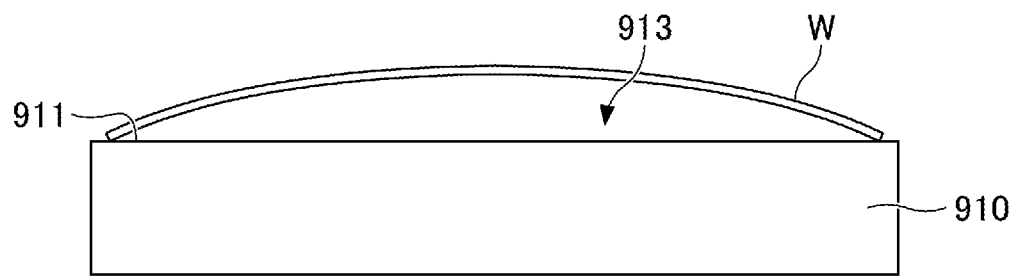
FIGS. 3A and 3B are diagrams for explaining problems caused by warpage of a substrate.
Figure 3B:
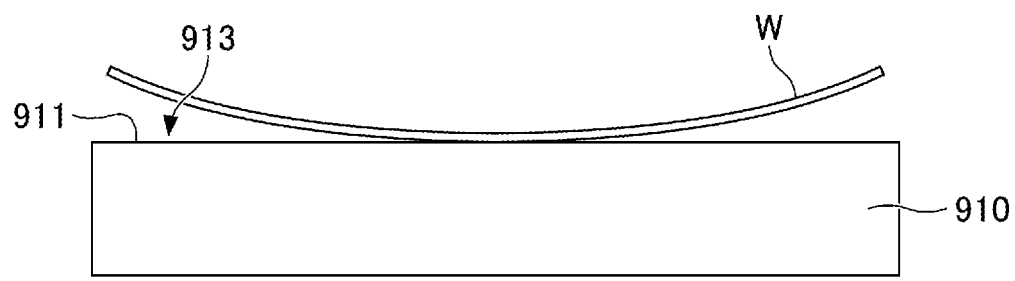

Also, as illustrated in FIG. 3A, in a case in which the substrate W has an upward warp shape, vacuum may leak from a gap 913 between the mounting surface 911 and the substrate W when the substrate W is vacuum adsorbed. Therefore, it is difficult to adsorb the substrate W to the mounting surface 911. Also, as illustrated in FIG. 3B, in a case in which the substrate W has a downward warp shape, vacuum may leak from a gap 913 between the mounting surface 911 and the substrate W when the substrate W is vacuum adsorbed. Therefore, it is difficult to adsorb the substrate W to the mounting surface 911.

Figure 4:
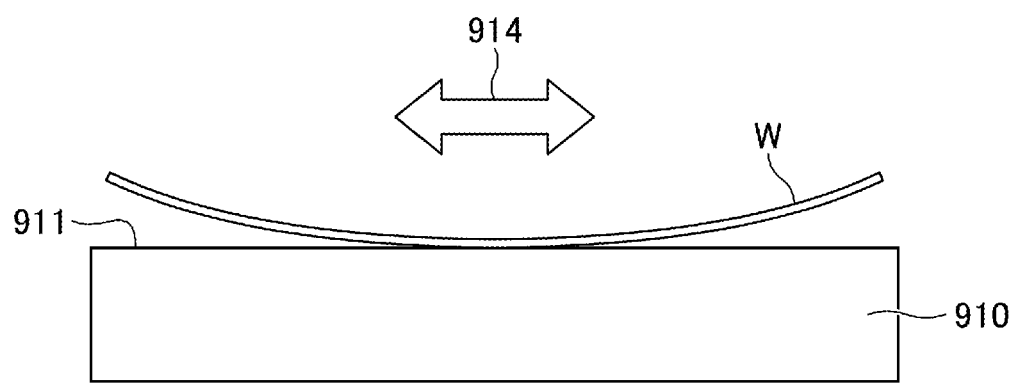
FIG. 4 is a diagram for explaining problems caused by warpage of a substrate.

Also, as illustrated in FIG. 4, in a case in which the substrate W has a downward warp shape, when the substrate W is mounted on the mounting surface 911, because the contact area between the mounting surface 911 and the substrate W is small, the substrate W may slide on the mounting surface 911 (see arrow 914). Therefore, it is difficult to mount the substrate W at a desired position on the mounting stage 910.

Further, as illustrated in FIG. 5A, when the adsorption of the substrate W vacuum-adsorbed on the mounting surface 911 is released, the substrate W may bounce or slip due to the restoring force of the warpage as illustrated in FIG. 5B.

In the following, a substrate holding mechanism, a substrate mounting method, and a substrate detaching method according to an embodiment that can hold and adsorb a warped substrate on a mounting stage will be described.

[Inspection Apparatus]

Referring to FIG. 6 and FIG. 7, as an example of an apparatus to which a substrate holding mechanism of an embodiment is applied, an inspection apparatus will be described. However, the substrate holding mechanism of the embodiment may also be applied to an apparatus other than the inspection apparatus.

The inspection apparatus 1 includes a loader section 10, an inspection section 20 and an apparatus controller 30. The inspection apparatus 1 transfers a substrate W as an inspection object from the loader section 10 to the inspection section 20 under the control of the apparatus controller 30. The inspection apparatus 1 inspects various electrical characteristics by applying an electrical signal to a DUT (Device under Test) formed on the substrate W. The substrate W may be, for example, a rectangular substrate. Examples of a rectangular substrate include PLP (Panel Level Package).

The loader section 10 includes a load port 11, an aligner 12, and a substrate transfer mechanism 13. The load port 11 mounts a cassette C accommodating substrates W. The aligner 12 aligns (adjusts the position of) the substrate W. The substrate transfer mechanism 13 transfers the substrate W between the cassette C mounted on the load port 11, the aligner 12, and the mounting stage 21, which will be described later below. For the loader section 10, first, the substrate transfer mechanism 13 transfers the substrate W accommodated in the cassette C to the aligner 12. Subsequently, the aligner 12 aligns the substrate W. Subsequently, the substrate transfer mechanism 13 transfers the aligned substrate W from the aligner 12 to the mounting stage 21 provided in the inspection section 20.

The inspection section 20 is disposed adjacent to the loader section 10. The inspection section 20 includes a mounting stage 21, a lifting and lowering mechanism 22, an XY stage 23, a probe card 24, and an alignment mechanism 25.

The mounting stage 21 has a rectangular mounting surface. At the mounting stage 21, the substrate W is mounted on the mounting surface. The mounting stage 21 may include, for example, a vacuum chuck.

The lifting and lowering mechanism 22 is provided below the mounting stage 21 to lift and lower the mounting stage 21 with respect to the XY stage 23. The lifting and lowering mechanism 22 may include, for example, a stepping motor.

The XY stage 23 is provided below the lifting and lowering mechanism 22 to move the mounting stage 21 and the lifting and lowering mechanism 22 in two axis directions (the X direction and the Y direction in the drawings). The XY stage 23 is fixed to the bottom of the inspection section 20. The XY stage 23 may include, for example, a stepping motor.

The probe card 24 is disposed above the mounting stage 21. A plurality of probes 24a is formed on the probe card 24 toward the mounting stage 21. The probe card 24 is detachably attached to a head plate 24b. A tester (not illustrated) is connected to the probe card 24 via a test head T.

The alignment mechanism 25 includes a camera 25a, guide rails 25b, and an alignment bridge 25c. The camera 25a is attached to the center of the alignment bridge 25c so as to face downward. The camera 25a captures an image of the mounting stage 21, the substrate W, and the like. The camera 25a may be, for example, a CCD camera or a CMOS camera. The guide rails 25b support the alignment bridge 25c so as to be movable in the horizontal direction (Y direction in the drawings). The alignment bridge 25c is supported by the pair of left and right guide rails 25b and is moved in the horizontal direction (Y direction in the drawings) along the guide rails 25b. As a result, the camera 25a moves between a standby position and a position immediately below the center of the probe card 24 (hereinafter referred to as "probe center") via the alignment bridge 25c. During alignment, the camera 25a located at the probe center captures an image of the electrode pads of the substrate W on the mounting stage 21 from above while the mounting stage 21 moves in the XY direction. The camera 25a performs image processing and displays the captured image on a display device 40.

In the inspection section 20, first, the alignment mechanism 25 aligns the electrode pads of a DUT formed on the substrate W on the mounting stage 21 with the plurality of probes 24a of the probe card 24. Then, the lifting and lowering mechanism 22 lifts the mounting stage 21 to bring the plurality of probes 24a of the probe card 24 into contact with the corresponding electrode pads. Subsequently, the apparatus controller 30 applies an inspection signal from the tester to the DUT formed on the substrate W via the test head T and the plurality of probes 24a of the probe card 24, thereby inspecting the electric characteristics of the DUT.

The apparatus controller 30 is provided below the mounting stage 21 to control the overall operation of the inspection apparatus 1. A CPU provided in the apparatus controller 30 executes a desired inspection according to product type parameters stored in a memory such as ROM or RAM. The product type parameters may be stored in a semiconductor memory other than the hard disk, the ROM or the RAM. The product type parameters may be recorded in a computer-readable recording medium such as a CD-ROM or a DVD to be inserted into a predetermined position and read.

<Substrate Holding Mechanism>

Referring to FIG. 8 and FIG. 9, an example of a substrate holding mechanism according to an embodiment will be described. FIG. 8 is a schematic plan view illustrating the example of the substrate holding mechanism according to the embodiment. FIG. 9 is a schematic cross-sectional view illustrating the example of the substrate holding mechanism according to the embodiment, and illustrates a cross-section cut at the dashed line IX-IX in FIG. 8. The substrate holding mechanism according to the embodiment can be applied, for example, as the mounting stage 21 of the inspection apparatus 1 described above.

The substrate holding mechanism 100 includes a mounting stage 110, a plurality of holding sections 120, protrusions 130, a lifting and lowering mechanism 140, and a horizontal moving mechanism 150.

The mounting stage 110 has a rectangular mounting surface 111. At the mounting stage 110, the substrate W is mounted on the mounting surface 111. The substrate W may be, for example, a rectangular substrate. The mounting stage 110 may include, for example, a vacuum chuck. The mounting stage 110 is lifted/lowered by a lifting and lowering mechanism 112 connected to the lower section.

The plurality of holding sections 120 are provided corresponding to the four sides of the mounting surface 111. The plurality of holding sections 120 includes holding sections 120a to 120e. Of the four sides of the mounting surface 111, the holding section 120a is provided corresponding to one side of the two sides facing each other in the first direction, and the holding section 120c is provided corresponding to the other side. That is, the holding section 120a and the holding section 120c are arranged so as to face each other with the mounting surface 111 interposed therebetween. Further, of the four sides of the mounting surface 111, the holding section 120b is provided corresponding to one side of the two sides facing each other in the second direction perpendicular to the first direction, and the holding sections 120d and 120e are provided corresponding to the other side. That is, the holding sections 120b and the holding sections 120d and 120e are arranged so as to face each other with the mounting surface 111 interposed therebetween. Each of the holding sections 120a to 120e has a generally rectangular shape of which the longitudinal direction is parallel to the side of the mounting surface 111. Each of the holding sections 120a120c has a length in the longitudinal direction approximately the same length as one side of the mounting surface 111. Each of the holding sections 120d and 120e has a length in the longitudinal direction of about ⅓ of the length of one side of the mounting surface 111. The holding section 120d is provided on one end side of the one side of the mounting surface 111 and the holding section 120e is provided on the other end side of the one side the mounting surface 111. Thereby, a gap D is formed between the holding section 120d and the holding section 120e, and a transfer arm (not illustrated) is inserted above the mounting stage 110 through the gap D. Each of the holding sections 120a to 120e includes an upper surface 121, a lower surface 122, and a wall section 123. Each upper surface 121 holds the lower surface of the peripheral section of the substrate W. Each lower surface 122 pushes the upper surface of the peripheral section of the substrate W mounted on the mounting stage 110. Each wall section 123 is configured to extend upwardly from the upper surface 121 to be contactable with an end surface of the substrate W and held by the upper surface 121.

The protrusions 130 protrude from the lower surfaces of the respective holding sections 120a to 120e and contact the end surface of the substrate W mounted on the mounting mounting stage 110 to correct the position of the substrate W. Each of the protrusions 130 may have, for example, a rod-like shape. Two protrusions 130 are provided symmetrically with the center of each of the holding sections 120a to 120c in the longitudinal direction interposed therebetween. Also, the protrusions 130 are provided at a substantially center in the longitudinal direction of each of the holding sections 120d and 120e. It should be noted that the number of protrusions 130 is one example and is not limited thereto. Also, the protrusions 130 may have, for example, a plate shape extending along the longitudinal direction of each holding sections 120a to 120e.

The lifting and lowering mechanism 140 is fixed to the outer peripheral wall of the mounting stage 110. The lifting and lowering mechanism 140 lifts/lowers the plurality of holding sections 120 relative to the mounting stage 110. The lifting and lowering mechanism 140 may be, for example, a guided cylinder.

The horizontal moving mechanism 150 is attached to the lifting and lowering mechanism 140 to be liftable/lowerable. The horizontal moving mechanism 150 moves the plurality of holding sections 120 horizontally between a closed position and an open position. The closed position is a position where the lower surface of the peripheral section of the substrate W is held or the upper surface of the peripheral section of the substrate W is pushed down, and is a position where the plurality of holding sections 120 approach the mounting stage 110. The open position is a position further away outwardly from the mounting stage 110 than the closed position. The horizontal moving mechanism 150 may be, for example, a rotary actuator.

<Substrate Mounting Method>

Referring to FIG. 10 to FIG. 16, a substrate mounting method of mounting the substrate W on the mounting stage 110 will be described as an example of an operation of the substrate holding mechanism 100 according to the embodiment.

As illustrated in FIG. 10A, it is assumed that in the initial state, the substrate W is not mounted on the mounting surface 111 of the mounting stage 110 and it is a stand-by state where the plurality of holding sections 120 are lowered at the closed position.

First, as illustrated in FIG. 10B, the apparatus controller 30 controls the lifting and lowering mechanism 140 to lift the plurality of holding sections 120.

Subsequently, as illustrated in FIG. 10C and FIG. 11A, the transfer arm 200 holding the substrate W is inserted over the mounting stage 110. In the embodiment, the substrate W has a downward warp shape. The transfer arm 200 corresponds to the substrate transfer mechanism 13 in the inspection apparatus 1 illustrated in FIG. 6 and FIG. 7.

Subsequently, as illustrated in FIG. 11B, as the transfer arm 200 lowers, the lower surface of the peripheral section of the substrate W held by the transfer arm 200 is held on the upper surfaces 121 of the plurality of holding sections 120. At this time, since the plurality of holding sections 120 hold the lower surface of the peripheral section of the substrate W, the substrate W can be securely held even when the substrate W is warped. Since the transfer arm 200 moves down through the gap D between the holding section 120d and the holding section 120e, the transfer arm 200 and the holding sections 120d and 120e do not come into contact with each other.

Subsequently, as illustrated in FIG. 11C, as the transfer arm 200 further moves down, the substrate W is spaced apart from the transfer arm 200 and the substrate W is delivered from the transfer arm 200 to the plurality of holding sections 120.

Subsequently, as illustrated in FIG. 12A and FIG. 12B, the transfer arm 200 is retracted from above the mounting stage 110. At this time, since the transfer arm 200 is retracted through the gap D between the holding section 120d and the holding section 120e, the transfer arm 200 and the holding sections 120d and 120e do not contact each other.

Subsequently, as illustrated in FIG. 12c, the apparatus controller 30 controls the lifting and lowering mechanism 140 to lower the plurality of holding sections 120. At this time, since the plurality of holding sections 120 can hold, with the upper surfaces 121, the lower surface of the peripheral section of the substrate W and can restrict, with the wall sections 123, the movement of the substrate W, the substrate W can be lowered in a stable manner.

Subsequently, as illustrated in FIG. 13A, when the plurality of holding sections 120 are further lowered, the substrate W is mounted on the mounting surface 111 of the mounting stage 110.

Subsequently, as illustrated in FIG. 13B, the apparatus controller 30 controls the horizontal moving mechanism 150 to move the plurality of holding sections 120 horizontally from the closed position to the open position.

Subsequently, as illustrated in FIG. 13C, the apparatus controller 30 controls the lifting and lowering mechanism 140 to lift the plurality of holding sections 120 so as to locate their lower surface 122 above the top Wa of the substrate W.

Subsequently, as illustrated in FIG. 14A to FIG. 14C, the apparatus controller 30 controls the horizontal moving mechanism 150 to gradually close the plurality of holding sections 120 from the open position. As a result, the protrusions 130 contact the end surface of the substrate W and the position of the substrate W is corrected. For example, in a case in which the central position of the substrate W is offset from the central position of the mounting stage 110, upon the plurality of holding sections 120 beginning to close, as illustrated in FIG. 14A, protrusion(s) 130 protruding from the lower surface of at least one holding section 120b of the plurality of holding sections 120 contact the end surface of the substrate W. Upon the plurality of holding sections 120 are further closed, as illustrated in FIG. 14B, the substrate W is moved to the direction of the holding section 120d facing the holding section 120b by the protrusions 130 protruding from the lower surface of the holding section 120b. Then, upon further closing the plurality of holding sections 120, the protrusions 130 protruding from the lower surfaces of all the holding sections 120a to 120e of the plurality of holding sections 120 contact the end surface of the substrate W, as illustrated in FIG. 14C. This causes the center of the substrate W to be aligned with the center of the mounting stage 110.

Subsequently, as illustrated in FIG. 15A and FIG. 15B, the apparatus controller 30 controls the lifting and lowering mechanism 140 to lower the plurality of holding sections 120, thereby pushing, with the lower surfaces 122, the upper surface of the peripheral section of the substrate W mounted on the mounting stage 110.

Subsequently, as illustrated in FIG. 15B, by the apparatus controller 30 starting adsorption by a vacuum chuck, the substrate W having the upper surface of the peripheral section pushed down is adsorbed to the mounting surface 111 of the mounting stage 110.

Subsequently, as illustrated in FIG. 15C, the apparatus controller 30 controls the lifting and lowering mechanism 140 to lift the plurality of holding sections 120.

Subsequently, as illustrated in FIG. 16A, the apparatus controller 30 controls the horizontal moving mechanism 150 to move the plurality of holding sections 120 horizontally from the closed position to the open position.

Subsequently, as illustrated in FIG. 16b, the apparatus controller 30 controls the lifting and lowering mechanism 140 to lower the plurality of holding sections 120.

Subsequently, as illustrated in FIG. 16C, the apparatus controller 30 controls the horizontal moving mechanism 150 to move the plurality of holding sections 120 from the open position to the closed position. Accordingly, the substrate holding mechanism 100 returns to the standby state. As described above, the substrate mounting method of the embodiment is completed.

As described above, according to the substrate mounting method of the embodiment, when receiving the substrate W from the transfer arm 200, the plurality of holding sections 120 hold, with the upper surfaces 121, the lower surface of the peripheral section of the substrate W. Thereby, the substrate W can be securely held even when the substrate W is warped.

Further, according to the substrate mounting method of the embodiment, in a state in which the lower surface of the peripheral section of the substrate W is held with the upper surfaces 121 of the plurality of holding sections 120, the plurality of holding sections 120 are lowered to mount the substrate W on the mounting surface 111. Accordingly, the substrate W can be lowered in a stable state.

Further, according to the substrate mounting method of the embodiment, the protrusions 130 contact the end surface of the substrate W mounted on the mounting surface 111 to correct the position of the substrate W. Therefore, when the substrate W is mounted on the mounting surface 111, even in a case in which the substrate W slides on the mounting surface 111 and the center of the substrate W is deviated from the center of the mounting stage 110, the center of the substrate W and the center of the mounting stage 110 can match.

According to the substrate mounting method of the embodiment, in a state in which the upper surface of the peripheral section of the substrate W mounted on the mounting surface 111 is pushed down by the lower surfaces 122 of the plurality of holding sections 120, the substrate W is adsorbed onto the mounting surface 111 by a vacuum chuck. Therefore, it is possible to prevent the vacuum from leaking when the substrate W is adsorbed by the vacuum chuck.

<Substrate Detaching Method>

Referring to FIG. 17 to FIG. 22, a substrate detaching method of detaching the substrate W vacuum-adsorbed on the mounting stage 110 will be described as another example of an operation of the substrate holding mechanism 100 according to the embodiment.

As illustrated in FIG. 17A, it is assumed that in the initial state, the substrate W is mounted on the mounting surface 111 of the mounting stage 110, and it is in the standby state where the plurality of holding sections 120 are lowered in the closed position.

First, as illustrated in FIG. 17B, the apparatus controller 30 controls the horizontal moving mechanism 150 to move the plurality of holding sections 120 from the closed position to the open position.

Subsequently, as illustrated in FIG. 17C, the apparatus controller 30 controls the lifting and lowering mechanism 140 to lift the plurality of holding sections 120 to locate their lower surfaces 122 above the upper surface of the substrate W.

Subsequently, as illustrated in FIG. 18A, the apparatus controller 30 controls the horizontal moving mechanism 150 to gradually close the plurality of holding sections 120 from the open position to cause the protrusions 130 to contact the end surface of the substrate W to lightly hold the substrate W.

Subsequently, as illustrated in FIG. 18B, the apparatus controller 30 releases the adsorption by the vacuum chuck. At this time, since the end surface of the substrate W is lightly held by the protrusions 130, it is possible to prevent the substrate W from bouncing or slipping due to the restoring force of warpage even if the substrate W has warpage. In addition, even if the substrate W bounces, because the substrate W is suppressed by the lower surfaces 122 of the plurality of holding sections 120, positional deviation due to the bouncing is prevented.

Subsequently, as illustrated in FIG. 18C, the apparatus controller 30 controls the horizontal moving mechanism 150 to move the plurality of holding sections 120 to the open position.

Subsequently, as illustrated in FIG. 19A, the apparatus controller 30 controls the lifting and lowering mechanism 140 to lower the plurality of holding sections 120.

Subsequently, as illustrated in FIG. 19B, the apparatus controller 30 controls the horizontal moving mechanism 150 to move the plurality of holding sections 120 from the open position to the closed position.

Subsequently, as illustrated in FIG. 19C, the apparatus controller 30 controls the lifting and lowering mechanism 140 to lift the plurality of holding sections 120. At this time, the plurality of holding sections 120 hold, with the upper surfaces 121, the lower surface of the peripheral section at the substrate W and can restrict, with the wall sections 123, the movement of the substrate W, and therefore the substrate W can be lifted in a stable state.

Subsequently, as illustrated in FIG. 20A and FIG. 20B, the transfer arm 200 not holding the substrate W is inserted between the mounting surface 111 of the mounting stage 110 and the lower surface of the substrate W. At this time, since the transfer arm 200 is inserted through the gap D between the holding section 120d and the holding section 120e, the transfer arm 200 and the holding sections 120d and 120e do not contact each other.

Subsequently, as illustrated in FIG. 20C, upon lifting the transfer arm 200, the substrate W held by the plurality of holding sections 120 is held by the transfer arm 200. At this time, since the transfer arm 200 lifts through the gap D between the holding section 120d and the holding section 120e, the transfer arm 200 and the holding sections 120d and 120e do not contact each other.

Subsequently, as illustrated in FIG. 21A, upon further lifting the transfer arm 200, the substrate W separates from the plurality of holding sections 120 and the substrate W is delivered from the plurality of holding sections 120 to the transfer arm 200.

Subsequently, as illustrated in FIG. 21B and FIG. 21C, the transfer arm 200 holding the substrate W is retracted from above the mounting stage 110.

Subsequently, as illustrated in FIG. 22, the apparatus controller 30 controls the lifting and lowering mechanism 140 to lower the plurality of holding sections 120. Thereby, the substrate holding mechanism 100 returns to the standby state. As described above, the substrate detaching method of the embodiment is completed.

As described above, according to the substrate detaching method of the embodiment, in a state in which the lower surface of the peripheral section of the substrate W is held by the upper surfaces 121 of the plurality of holding sections 120, the plurality of holding sections 120 are lifted to separate the substrate W from the mounting surface 111. Accordingly, the substrate W can be lifted in a stable state.

According to the substrate detaching method of the embodiment, in a state in which the end surface of the substrate W is lightly held by the protrusions 130, the adsorption by the vacuum chuck is released. Accordingly, even when the substrate W has warpage, it is possible to prevent the substrate W from bouncing or slipping due to the restoring force of the warpage.

The embodiments disclosed herein should be considered to be exemplary in all respects and not restrictive. The above embodiments may be omitted, substituted, or modified in various forms without departing from the appended claims and spirit thereof.

In the embodiments described above, the substrate W is a rectangular substrate, but the present disclosure is not limited thereto. For example, the substrate W may be a circular substrate. Examples of circular substrates include WLP (Wafer Level Package). In case in which the substrate W is a circular substrate, for example, the mounting stage is configured to have a circular mounting surface and the plurality of holding sections are configured to have a substantially arc shape.

What is claimed is:

1. A substrate holding mechanism comprising:
    a mounting stage on which a substrate is mounted;
    a plurality of holding sections each of which includes an upper surface that holds a lower surface of a peripheral section of the substrate and includes a lower surface that pushes down an upper surface of the peripheral section of the substrate mounted on the mounting stage;
    a protrusion that is provided on the plurality of holding sections and that contacts an end surface of the substrate mounted on the mounting stage to correct a position of the substrate;
    a lifting and lowering mechanism configured to lift and lower the plurality of holding sections; and
    a horizontal moving mechanism configured to horizontally move the plurality of holding sections.

2. The substrate holding mechanism according to claim 1, wherein the protrusion is provided so as to protrude downwardly from the lower surface of each of the plurality of holding sections.

3. The substrate holding mechanism according to claim 1, wherein the mounting stage has a rectangular mounting surface.

4. The substrate holding mechanism according to claim 3, wherein the plurality of holding sections are provided corresponding to at least two opposite sides of four sides of the mounting surface.

5. The substrate holding mechanism according to claim 3, wherein the plurality of holding sections are provided corresponding to all of four sides of the mounting surface.

6. The substrate holding mechanism according to claim 1, wherein each of the plurality of holding sections has a wall section extending upwardly from the upper surface and is contactable with the end surface of the substrate held by the upper surface.

7. The substrate holding mechanism according to claim 1, wherein the lifting and lowering mechanism is configured to lift and lower the holding sections, the protrusion, and the horizontal moving mechanism.

8. The substrate holding mechanism according to claim 1, wherein the mounting stage includes a vacuum chuck that adsorbs the substrate.

* * * * *